(12) United States Patent
Chen

(10) Patent No.: US 7,888,155 B2
(45) Date of Patent: Feb. 15, 2011

(54) PHASE-CHANGE MEMORY ELEMENT AND METHOD FOR FABRICATING THE SAME

(75) Inventor: Frederick T Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 138 days.

(21) Appl. No.: 12/405,173

(22) Filed: Mar. 16, 2009

(65) Prior Publication Data

US 2010/0230653 A1  Sep. 16, 2010

(51) Int. Cl.
*H01L 21/00* (2006.01)
(52) U.S. Cl. .............. 438/54; 438/430; 257/2; 257/52; 257/467; 257/E45.002; 257/E21.645
(58) Field of Classification Search ............ 438/54, 438/95, 102, 103, 385, 430; 257/2, 4, 42, 257/52, 63, 65, 467, 613, 614, E31.029, E45.002, 257/E21.004, E21.546, E21.645
See application file for complete search history.

(56) References Cited

U.S. PATENT DOCUMENTS

| | | | |
|---|---|---|---|
| 7,589,344 B2 * | 9/2009 | Sato | 257/4 |
| 2006/0006374 A1 * | 1/2006 | Chang | 257/2 |
| 2006/0208847 A1 * | 9/2006 | Lankhorst et al. | 338/9 |
| 2007/0190696 A1 | 8/2007 | Happ | |
| 2007/0215852 A1 | 9/2007 | Lung | |
| 2007/0235709 A1 | 10/2007 | Kostylev et al. | |

* cited by examiner

*Primary Examiner*—Matthew C Landau
*Assistant Examiner*—Joseph C Nicely

(57) ABSTRACT

A phase-change memory element is provided. The phase-change memory element includes: a first electrode formed on a substrate; a first dielectric layer, with an opening, formed on the first electrode, wherein the opening exposes a top surface of the first electrode; a pillar structure formed directly on the first electrode within the opening; an inner phase-change material layer surrounding the pillar structure, directly contacting the first electrode; a second dielectric layer surrounding the inner phase-change material layer; an outer phase-change material layer surrounding the second dielectric layer; a phase-change material collar formed between the second dielectric layer and the first electrode, connecting the inner phase-change material layer with the outer phase-change material layer; and a second electrode formed directly on the pillar structure, directly contacting the top surface of the inner phase-change material layer.

21 Claims, 9 Drawing Sheets

PHASE-CHANGE MEMORY ELEMENT AND METHOD FOR FABRICATING THE SAME

BACKGROUND OF THE INVENTION

1. Field of the Invention

The invention relates to a memory element, and more particularly to a phase-change memory element.

2. Description of the Related Art

A phase-change memory must be highly reliable, have fast speeds, have low current, and have low operating voltage, in order to become a viable alternative to current memories such as flash and DRAM. A phase-change memory cell must therefore provide low programming current, low operating voltage, a small size, and fast phase transformation speeds, at low costs. The requirements are difficult to meet given the current state of the art.

Phase-change memories are mainly used in devices that utilize non-volatile flash memories, such as mobile devices which require low power consumption, and hence, minimal programming currents. Thus, a phase-change memory cell is designed to provide low programming current, high reliability (including electromigration risk), a small cell size, and fast phase transformation speed.

The conventional method to reduce programming current is to reduce the heating area (the contact area between phase-change material layer and electrode) of the phase-change memory. A benefit of the method is simultaneous reduction of cell size and enhancement of integrated density. However, reduction of heating area is limited by the resolution limits of the photolithography process, resulting in minimal reduction of programming current. Further, reducing the heating area of the phase-change memory results in higher cell resistance, which increases required driving voltage. Thus, all other considerations being the same, the amount of Joule heating is conserved, wherein the operating voltage is inversely proportional to the programming current, which is not desirable. Specifically, reducing the heating area does not necessarily improve other performance features of the phase-change memory. Fast phase transformation speed also requires good thermal uniformity within the active regions of the cell.

In reality, cooling becomes significant for smaller structures, and heat loss to surrounding areas becomes more important with increased surface/volume ratio. As a result, temperature uniformity is degraded. In addition, required current density must increase as heating area decreases. Thus, increasing reliability concerns for electromigration. Hence, in practice, it is important to not only reduce the current of the phase-change memory, but also required heating. Specifically, with a decrease in the amount of Joule heating input, heat loss to surrounding areas must be decreased even further.

Kostylev et al. (U.S. Publication No. 20070235709) disclosed a phase-change memory comprising an electrode with a sidewall in contact with a phase-change material layer. The aforementioned structure, however, suffers from low heating efficiency due to current being forced to spread outward.

Lung et al. (U.S. Publication No. 20070215852) disclosed a phase-change memory comprising a pipe-shaped electrode in contact with a phase-change material layer. The aforementioned structure, however, is also apt to result in reduced heating efficiency, as current is forced to spread inward instead of outward as disclosed in Kostylev et al.

Happ et al. (U.S. Publication No. 20070190696) disclosed a phase-change memory comprising a bottom electrode, an isolation layer with an opening formed on the bottom electrode, a barrier layer conformally formed on the isolation layer, a phase-change material layer filled in the opening, and a top electrode formed on the phase-change material layer. The heating area, however, is limited by the diameter of the opening formed by a photolithography process, thereby hindering increase of heating efficiency and reduction of the programming current of the phase-change memory cells.

Therefore, it is desirable to provide a phase-change memory cell structure that improves upon the aforementioned problems.

BRIEF SUMMARY OF THE INVENTION

An exemplary embodiment of a phase-change memory element includes: a first electrode formed on a substrate; a first dielectric layer, with an opening, formed on the first electrode, wherein the opening exposes a top surface of the first electrode; a pillar structure formed directly on the first electrode within the opening; an inner phase-change material layer surrounding the pillar structure, directly contacting the first electrode; a second dielectric layer surrounding the inner phase-change material layer; an outer phase-change material layer surrounding the second dielectric layer; a phase-change material collar formed between the second dielectric layer and the first electrode, connecting the inner phase-change material layer with the outer phase-change material layer; and a second electrode formed directly on the pillar structure, directly contacting the top surface of the inner phase-change material layer.

An exemplary embodiment provides a method for forming the aforementioned phase-change memory element, including providing a first electrode on the substrate; forming a first dielectric layer with an opening on the first electrode, wherein the opening exposes a top surface of the first electrode; conformally forming a second dielectric layer on the first dielectric layer, covering the side walls and the bottom surface of the opening; forming a non-phase-change layer as a blanket film on the second dielectric layer; performing a first planarizing process to remove a portion of the second dielectric layer and the non-phase-change layer with the first dielectric layer acting as a stop layer, leaving a pillar comprising non-phase-changing material sitting on top of the second dielectric material, and a remaining second dielectric layer; etching the remaining second dielectric layer with the non-phase-change material pillar as an etching mask, leaving a second dielectric pillar, wherein the non-phase-change material pillar and the second dielectric pillar comprises a pillar structure; conformally forming a phase-change material layer on the first dielectric layer, the exposed top surface of the first electrode and the pillar structure, defining a collar opening; forming a third dielectric layer as a blanket film on the phase-change material layer, filling the collar opening; performing a second planarizing process to remove a portion of the phase-change material layer and the third dielectric layer with the first dielectric layer acting as a stop layer, leaving an inner phase-change material layer surrounding the pillar structure, a remaining third dielectric layer surrounding the inner phase-change material layer, an outer phase-change material layer surrounding the remaining third dielectric layer, and a phase-change material collar formed directly below the remaining third dielectric layer and connecting the inner phase-change material layer and the outer phase-change material layer; and forming a second electrode formed directly on the pillar structure, directly contacting the top surface of the inner phase-change material layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
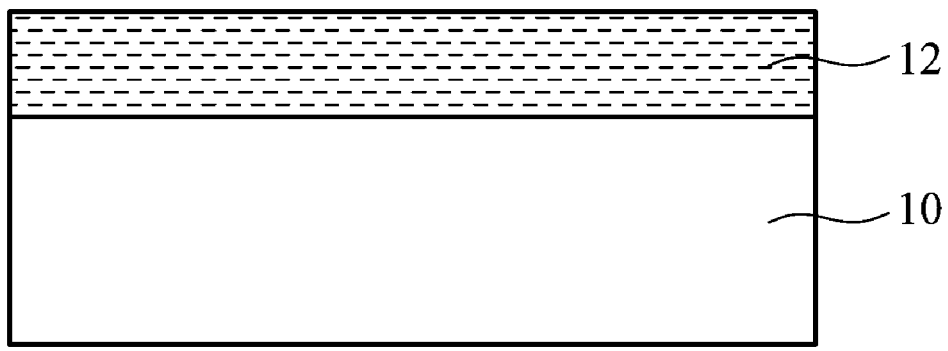
FIGS. 1a-1j are cross sections of a method for fabricating a phase-change memory element according to an embodiment of the invention.

First, referring to FIG. 1a, a substrate 10 with a first electrode 12 is provided. Particularly, the substrate 10 can be a substrate employed in a semiconductor process, such as a silicon substrate. The substrate 10 can include a complementary metal oxide semiconductor (CMOS) circuit, an isolation structure, a diode, a transistor, or a capacitor (not shown). Suitable material for the first electrode 12, for example, can include Al, W, Mo, Ti, TiN, TiAlN, TiW or TaN.

Figure 1B:
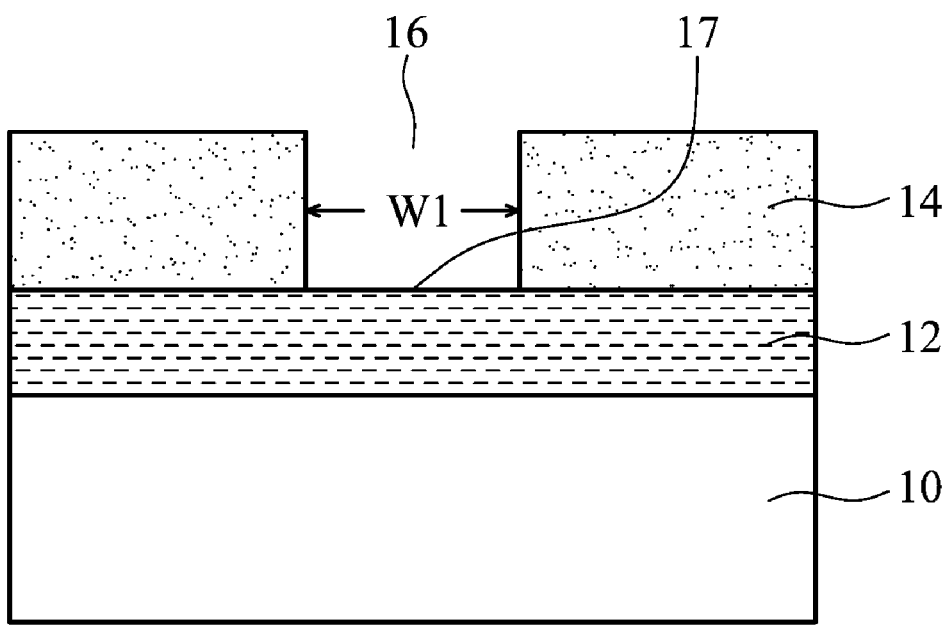

Next, referring to FIG. 1b, a first dielectric layer 14 with an opening 16 is formed on the first electrode 12, wherein the opening 16 exposing a top surface 17 of the first electrode 12. The top view of the opening, for example, can be circular and has a diameter (cross-section width) W1 of 15-70 nm. In some embodiments of the invention, the top view of the opening can be rectangular. Materials of the first dielectric layer 14 are unlimited, and can be oxide-containing dielectric material, such as silicon oxide.

Figure 1C:
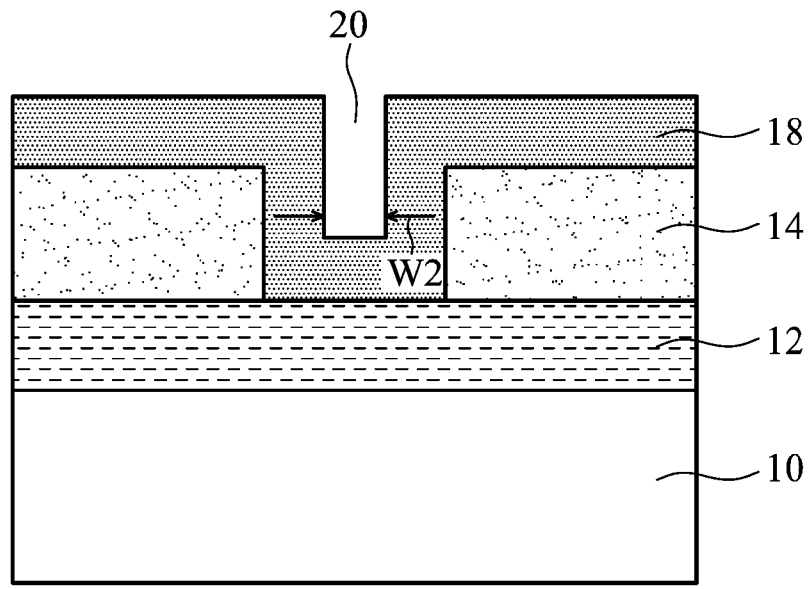

Next, referring to FIG. 1c, a second dielectric layer 18 is conformally formed on the first dielectric layer 14 and the exposed top surface 17 of the first electrode 12, covering all the side walls and the bottom surface of the opening. Further, an opening 20 is formed and defined by the second dielectric layer 18 filled in the opening 16. The cross-section width W2 of the opening 20 can be between 5-20 nm. Materials of the second dielectric layer 18 are different from that of the first dielectric layer 14 and can be nitride-containing dielectric material, such as silicon nitride. Namely, the etching rate of the first dielectric layer 14 is different from that of the second dielectric layer 18 when etched by the subsequent etching process.

Figure 1D:
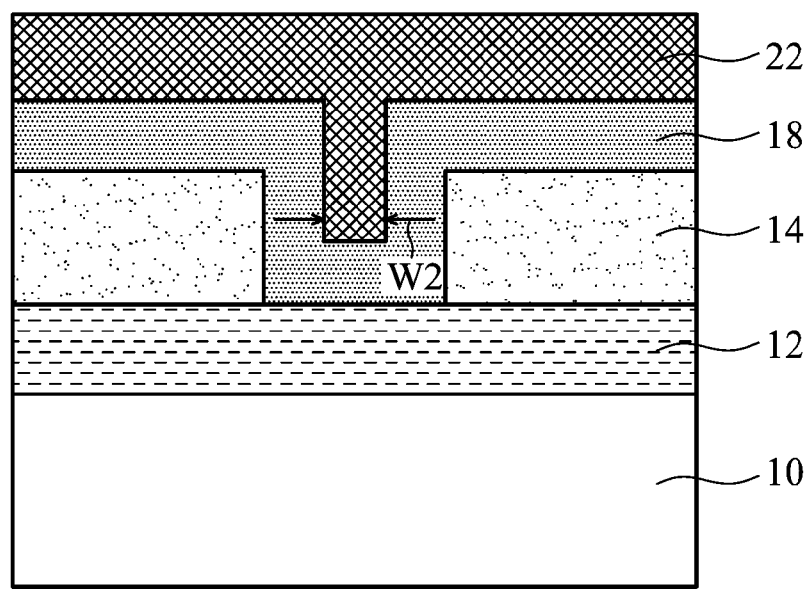

Next, referring to FIG. 1d, a non-phase-change layer 22 is formed as a blanket film on the second dielectric layer 18 and filled with the opening 20. It should be noted that the non-phase-change material layer excludes chalcogenide (such as a layer including In, Ge, Sb, Te or combinations thereof, for example GeTe, GeSb, SbTe, GeSbTe or InGeSbTe). Specifically, the non-phase-change material layer is made of a conductive material (such as Al, W, Mo, Ti, TiN, TiAlN, TiW or TaN) or a dielectric material. When the non-phase-change material layer 22 is made of dielectric material, the material of that non-phase-change material layer is different from that of the first dielectric layer 14 or the material of the second dielectric layer 18. It should be noted that the etching rate of the non-phase-change material layer 22 is different from that of the first dielectric layer 14 or that of the second dielectric layer 18 when etched by the subsequent etching processes.

Figure 1E:
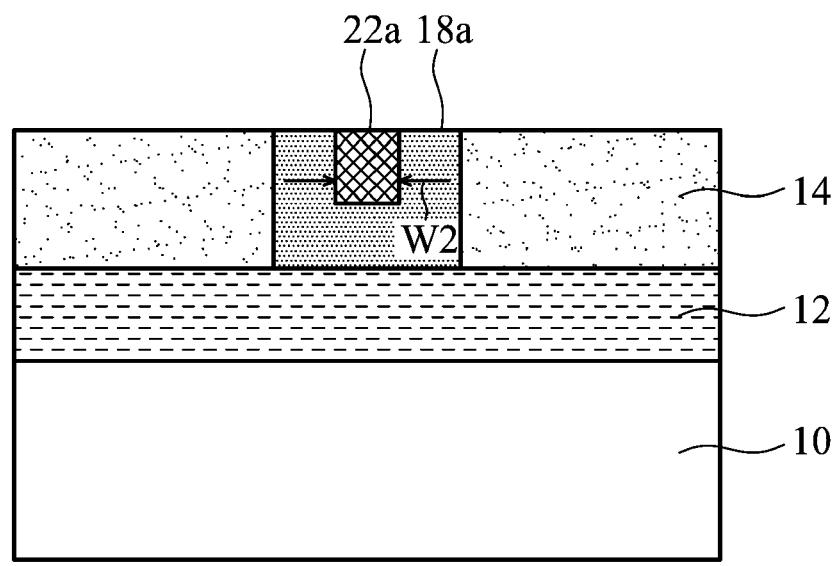

Next, referring to FIG. 1e, a first planarizing process is performed to remove a portion of the second dielectric layer 18 and the non-phase-change material layer 22 with the first dielectric layer 14 acting as a stop layer, leaving a non-phase-change material pillar 22a and a remaining second dielectric layer 18a. The non-phase-change material pillar 22a has a cross-section width W2 of between 5-20 nm. The planarizing process can be a chemical mechanical polishing (CMP).

Figure 1F:
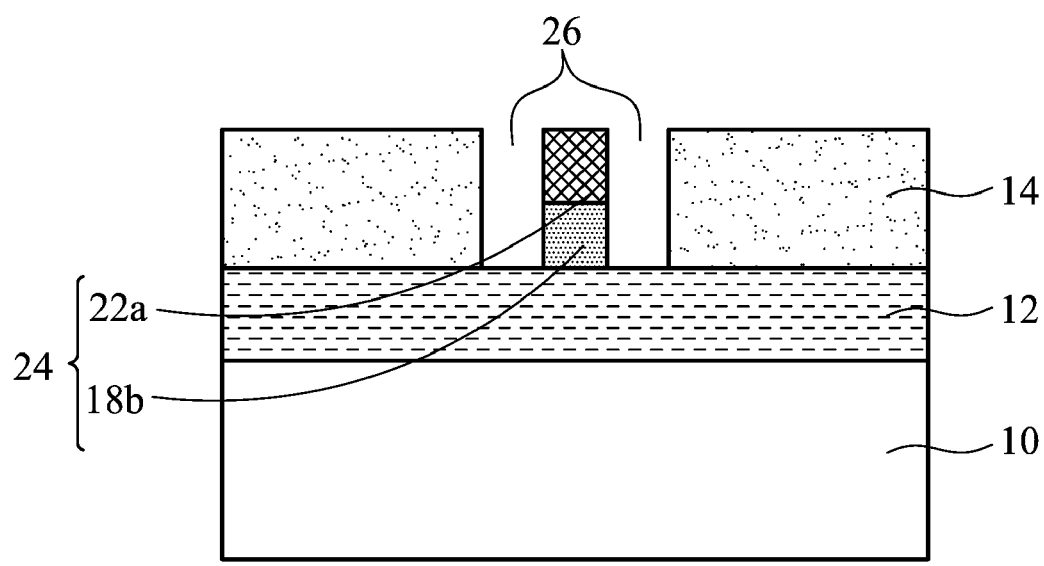
Figure 2:
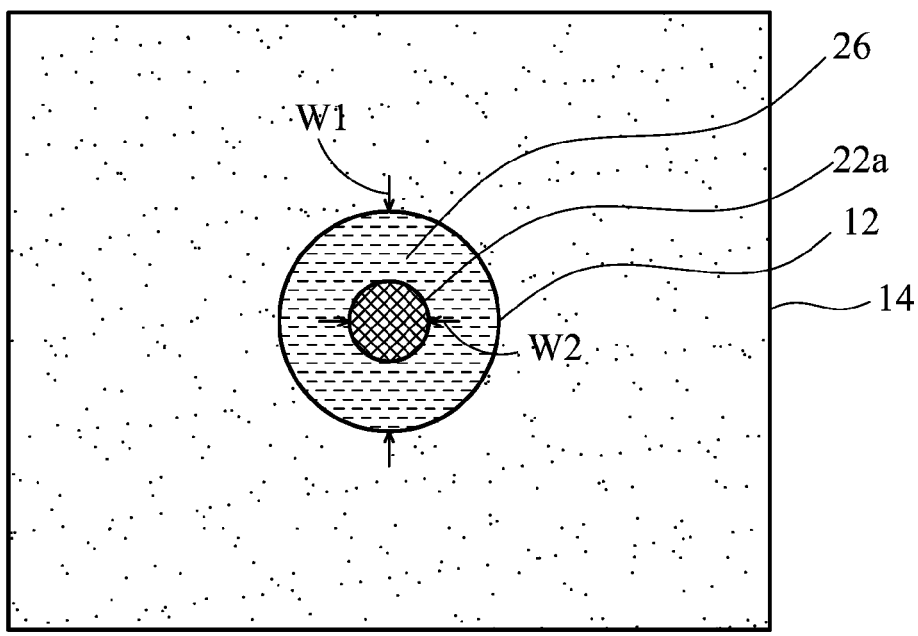
FIG. 2 is a top view of the structure shown in FIG. 1f.

Next, referring to FIG. 1f, the remaining second dielectric layer 18a is etched with the non-phase-change material pillar 22a as an etching mask, leaving a second dielectric pillar 18b. The non-phase-change material pillar 22a and the second dielectric pillar 18b comprise a pillar structure 24, and the cross-section width of the pillar structure 24 depends on the cross-section width of the opening. In the etching process, the second dielectric layer 18 has an etching rate exceeding that of the non-phase-change material pillar 22a and that of the first dielectric layer 14. After etching, a collar opening 26 surrounding the pillar structure 24 is formed, and reference may be made to FIG. 2, a top view of the structure shown in FIG. 1f.

Figure 1G:
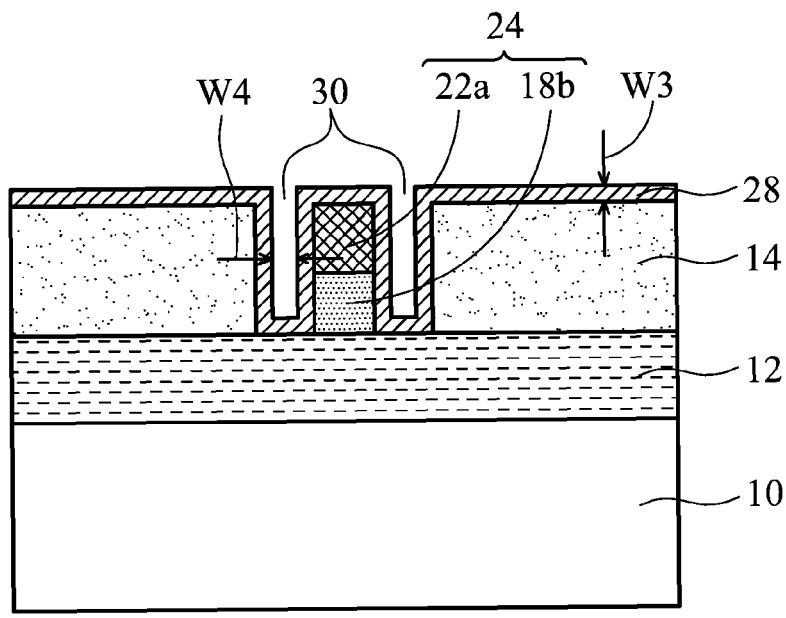

Next, referring to FIG. 1g, a phase-change material layer 28 is conformally formed on the above structure shown in FIG. 1f, covering all the surfaces of the collar opening 26 and all the surfaces of the pillar structure 24 and defining a smaller collar opening 30 with a cross-section width W4. It should be noted that the thickness W3 of the phase-change material layer 28 must be controlled to prevent completely filling the collar opening 26 with the phase-change material layer 28. Herein, the thickness W3 of the phase-change material layer 28 can be between 2-10 nm, and the cross-section width W4 of the smaller collar opening 30 can be between 1-28.5 nm. The phase-change material layer 28 can include In, Ge, Sb, Te, Sn, Ga or combinations thereof, such as GeSbTe or InGeSbTe.

Figure 1H:
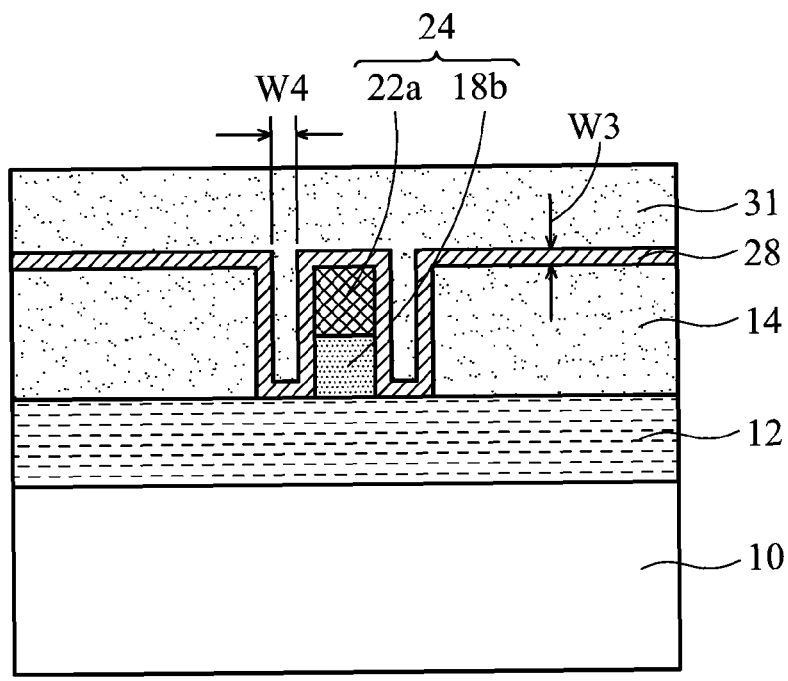

Next, referring to FIG. 1h, a third dielectric layer 31 is formed as a blanket film on the phase-change material layer 28, filling with the smaller collar opening 30. Materials of the third dielectric layer 31 are unlimited, and can be oxide-containing dielectric materials, such as silicon oxide. In an embodiment, the materials of the third dielectric layer 31 can be the same size as the materials of the third dielectric layer 14.

Figure 1I:
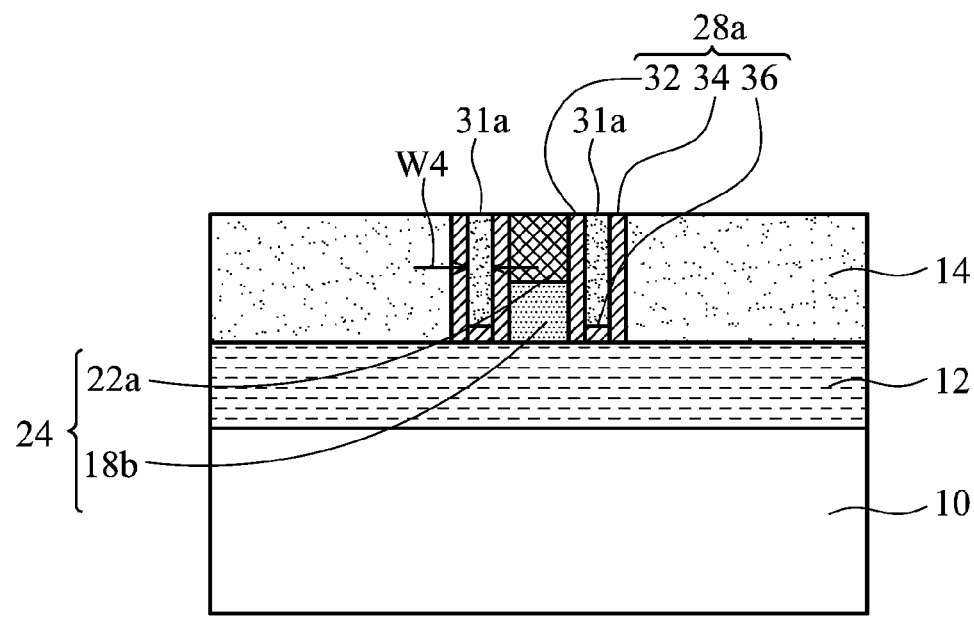
Figure 3:
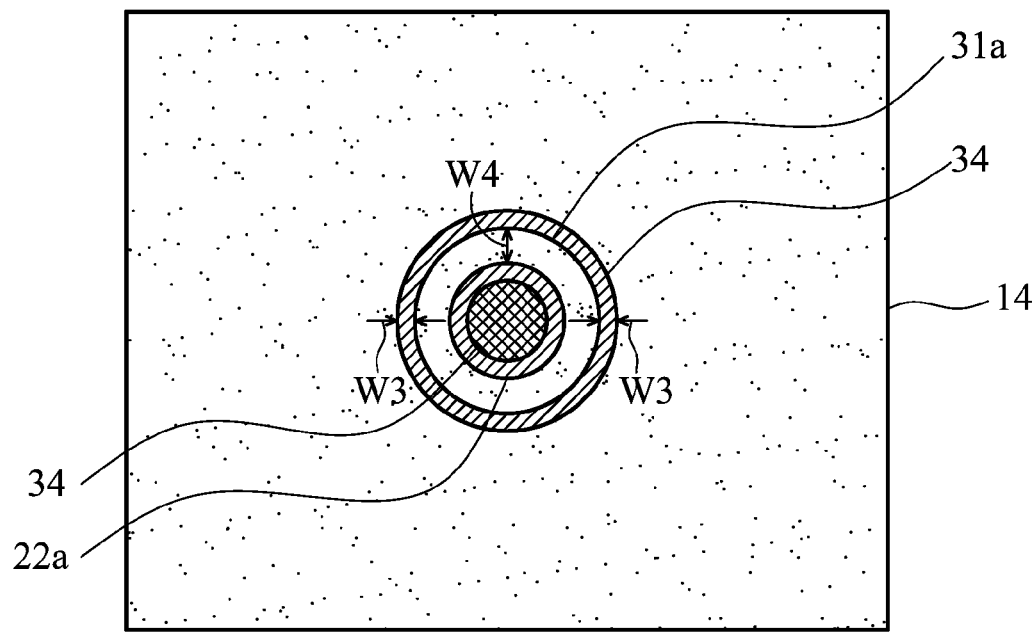
FIG. 3 is a top view of the structure shown in FIG. 1i.

Next, referring to FIG. 1i, a second planarizing process is performed to remove a portion of the phase-change material layer 28 and a portion of the third dielectric layer 31 with the first dielectric layer 14 acting as a stop layer, leaving a remaining phase-change material layer 28a and a remaining third dielectric layer 31a. Particularly, the remaining phase-change material layer 28a comprises an inner phase-change material layer 32 surrounding the pillar structure 24, an outer phase-change material layer 34 surrounding the remaining third dielectric layer 31a, and a phase-change material bridge 36 formed directly below the remaining third dielectric layer 31a. The remaining third dielectric layer 31a surrounds the inner phase-change material layer 32 and the phase-change material bridge 36 connects the inner phase-change material layer 32 with the outer phase-change material layer 34. It should be noted that, after performing the second planarizing process, the top surface of the first dielectric layer 14, the top surface of the pillar structure 24, the top surface of the remaining third dielectric layer 31a, the top surface of the inner phase-change material layer 32, and the top surface of inner phase-change material layer 34 are coplanar. The bottom surface of the inner phase-change material layer 32, the bottom surface of the outer phase-change material layer 34, and the bottom surface of the phase-change material bridge 36 are coplanar. Referring to FIG. 3, which is a top view of the structure of FIG. 1i, wherein the inner phase-change material layer 32, the remaining third dielectric layer 31a, and the outer phase-change material layer 34 are concentric with the pillar structure 24 (comprising the non-phase-change material pillar 22a and the second dielectric pillar 18b). The inner phase-change material layer 32 and the outer phase-change material layer 34 have same cross-section width W3 which is the same size as the thickness W3 of the phase-change material layer 28 and the remaining third dielectric layer 31a has a cross-section width W4 which is the same as the cross-section width W4 of the smaller collar opening 30.

Figure 1J:
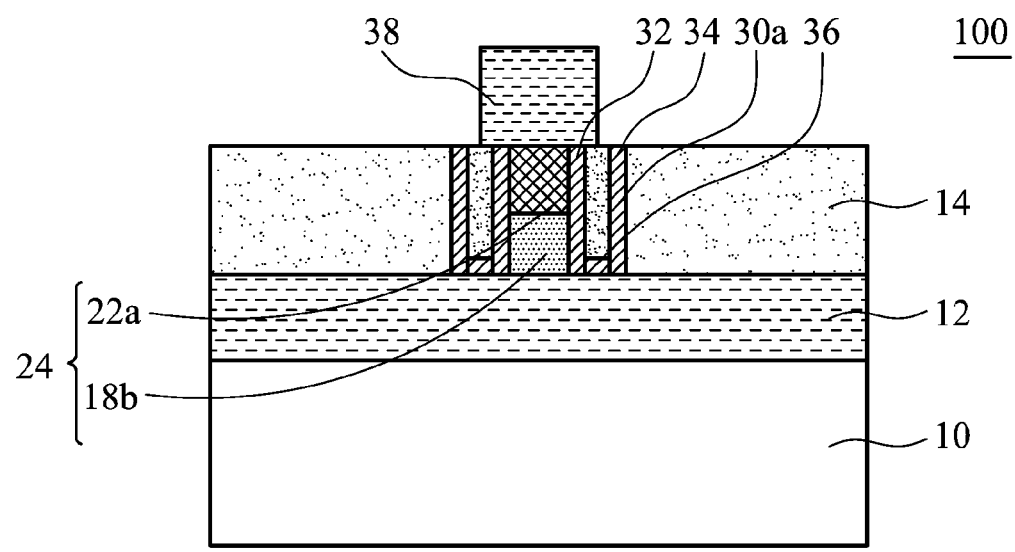
Figure 4:
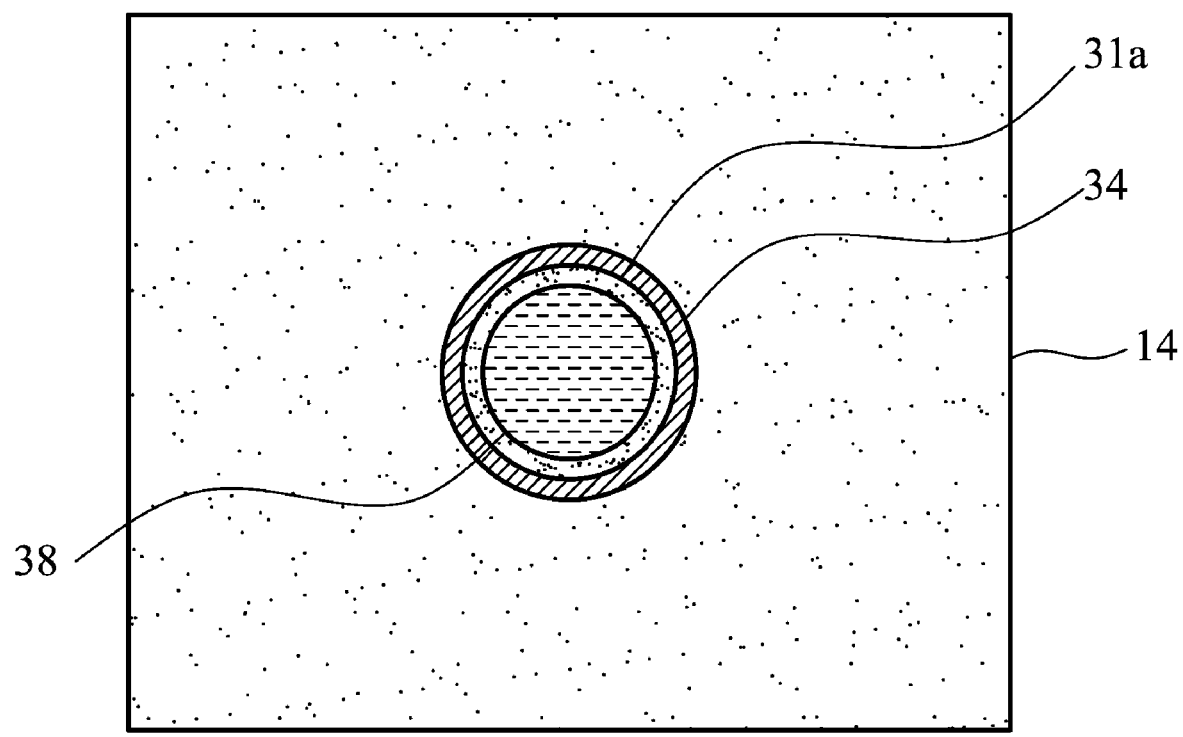
FIG. 4 is a top view of the structure shown in FIG. 1j.

Finally, referring to FIG. 1j, a second electrode 38 is formed directly on the pillar structure 24, directly contacting to the top surface of the inner phase-change material layer 32. Thus, completing the process for forming a phase-change memory element 100. The second electrode 38, for example, can include Al, W, Mo, Ti, TiN, TiAlN, TiW or TaN. It should be noted that, in an embodiment of the invention, the second electrode 38 does not directly contact with the outer phase-change material layer 34, as shown in FIG. 4, a top view of the structure of FIG. 1j, Namely, the second electrode 38 is electrically connected to the first electrode 12 via the inner phase-change material layer 32

The following example is intended to illustrate the invention more fully without limiting its scope, since numerous modifications and variations will be apparent to those skilled in this art.

EXAMPLE 1

A silicon substrate was provided. A TiN layer with a thickness of 50 nm serving as bottom electrode was formed on the substrate. Next, a first silicon oxide layer with a thickness of 60 nm was formed on the bottom electrode, wherein the first silicon oxide layer had a first opening with a diameter of 50 nm. Next, a silicon nitride layer was conformally formed on the silicon oxide layer and the exposed top surface of the bottom electrode, covering all the side walls and the bottom surface of the opening. Further, an second opening was formed and defined by the silicon nitride layer filled into the first opening. The cross-section width W2 of the second opening was 10 nm. Next, a non-phase-change material layer such as conductive metal TiN was formed as a blanket film on the silicon nitride layer and filled with the second opening. Next, a first chemical mechanical polishing process was performed to remove a portion of the silicon nitride layer and the non-phase-change material layer (TiN) with the first silicon oxide layer acting as a stop layer, leaving a non-phase-change material pillar and a remaining silicon nitride layer. The non-phase-change material pillar had a cross-section width W2 of 10 nm. Next, the remaining silicon nitride layer was etched with the non-phase-change material pillar as an etching mask, leaving a silicon nitride pillar. The non-phase-change material pillar and the silicon nitride pillar comprised a pillar structure, and the cross-section width of the pillar structure depended on the cross-section width W2 of the second opening. After etching, a first collar opening surrounding the pillar structure was formed. Next, a phase-change material layer (InGeSbTe) with a thickness W3 of 4 nm was conformally formed on the above structure, covering all the surfaces of the first collar opening and all the surfaces of the pillar structure, defining a second collar opening with a cross-section width W4 of 12 nm. Next, a second silicon oxide layer was formed as a blanket film on the phase-change material layer, filling with the second collar opening. Next, a chemical mechanical polishing process is performed to remove a portion of the phase-change material layer and a portion of the second silicon oxide layer with the first silicon oxide layer acting as a stop layer, leaving a remaining phase-change material layer and a remaining second silicon oxide layer. Particularly, the remaining phase-change material layer comprised an inner phase-change material layer surrounding the pillar structure, an outer phase-change material layer surrounding the remaining second silicon oxide layer, and a phase-change material bridge formed directly below the remaining second silicon oxide layer. The remaining second silicon oxide layer surrounded the inner phase-change material layer and the phase-change material bridge connects the inner phase-change material layer and the outer phase-change material layer. The inner phase-change material layer and the outer phase-change material layer had same cross-section width W3 which is the same size as the thickness W3 (4 nm) of the phase-change material layer and the remaining second silicon oxide layer had a cross-section width W4 which was the same size as the cross-section width W4 (12 nm) of the second collar opening. Finally, a TiN block serving as top electrode was formed directly on the pillar structure, directly contacting the top surface of the inner phase-change material layer without directly contacting the surface of the outer phase-change material layer, thus obtaining a phase-change memory element A.

Figure 5:
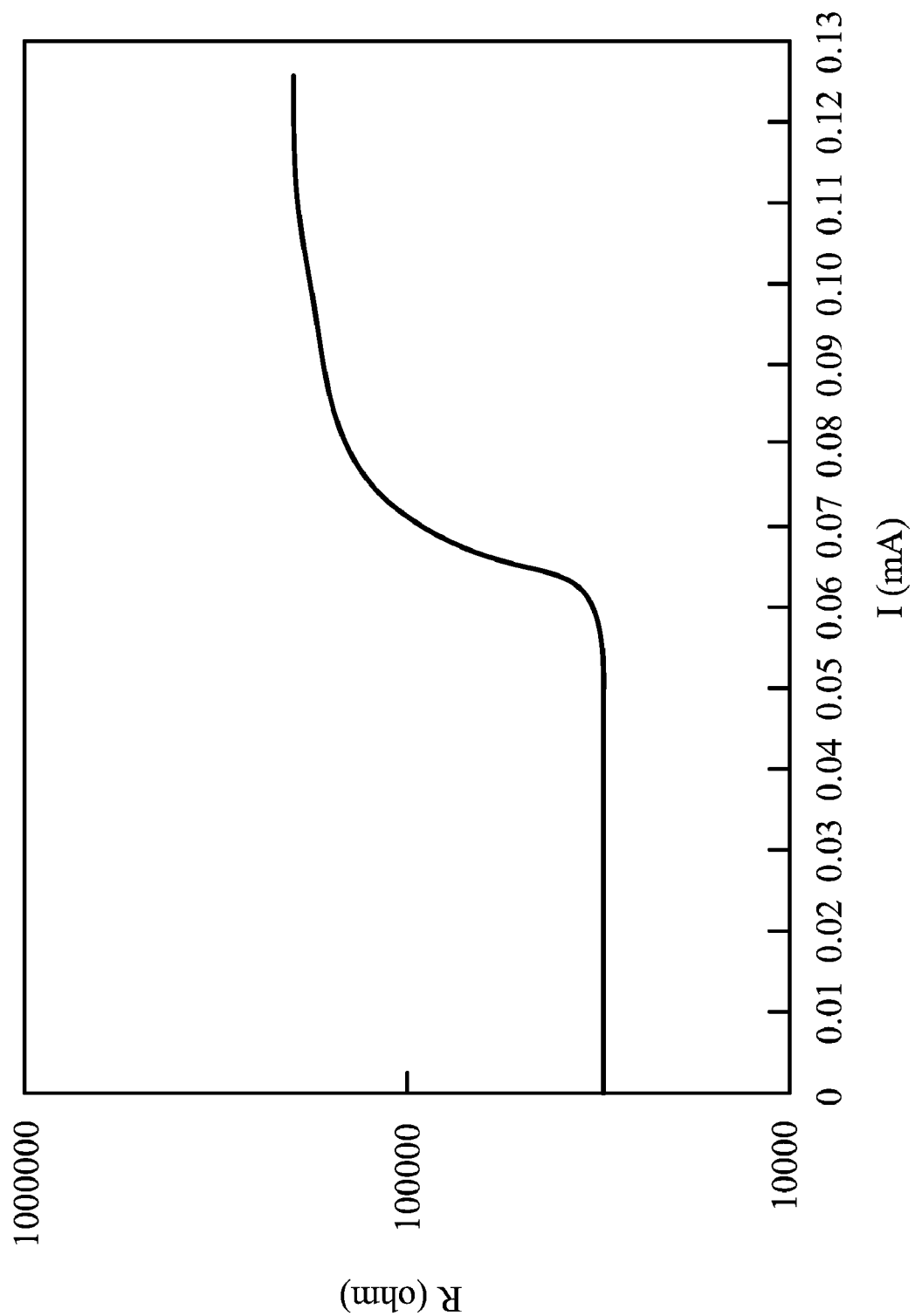
FIG. 5 is a graph plotting resistance against current of the phase-change memory element A as disclosed in Example 1.
Figure 6:
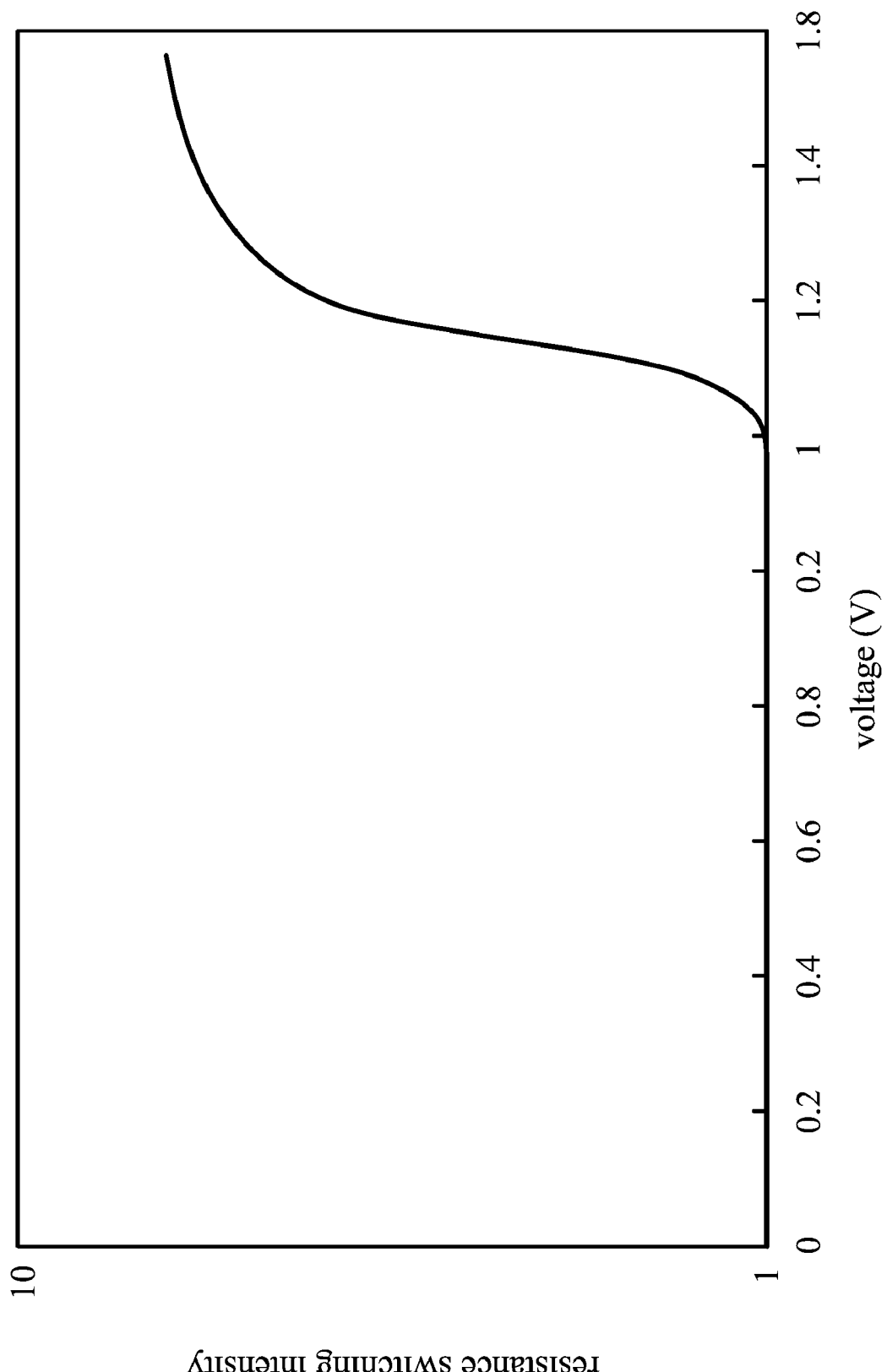
FIG. 6 is a graph plotting resistance switching intensity against voltage of the phase-change memory element A as disclosed in Example 1.

FIG. 5 is a graph showing the resistance against current of the phase-change memory element A. The resistance switching property against voltage of the phase-change memory element A is shown in FIG. 6. Accordingly, the phase-change memory element of the invention has the following advantages:

Low current: Because the active region is defined as the contact region between the inner phase-change material layer and the top electrode forming a contact collar, and the cross-section width of the contact collar can be controlled by modifying the thickness of the phase-change material layer, thus achieving low current.

High Programming Speed: Because the outer phase-change material has low thermal conductivity, the interior is isolated from the surrounding environment. As a result, the interior active region heats up faster and more uniformly, increasing programming speed. Additionally, the thermal uniformity also improves the phase-change speed, since the active region can be entirely programmed to the optimum temperature.

Low voltage: Because the pillar height can be made lower and controlled between 20-70 nm to reduce the driving voltage. In addition, if the top portion of the pillar is conductive material such as TiN, the driving voltage can be reduced significantly further.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-change memory element, comprising
a first electrode formed on a substrate;
a first dielectric layer, with an opening, formed on the first electrode, wherein the opening exposes a top surface of the first electrode;
a pillar structure formed directly on the first electrode within the opening;
an inner phase-change material layer surrounding the pillar structure, directly contacting the first electrode;
a second dielectric layer surrounding the inner phase-change material layer;
an outer phase-change material layer surrounding the second dielectric layer;
a phase-change material collar formed between the second dielectric layer and the first electrode, connecting the inner phase-change material layer with the outer phase-change material layer; and
a second electrode formed directly on the pillar structure, directly contacting the top surface of the inner phase-change material layer.

2. The phase-change memory element as claimed in claim 1, wherein the inner phase-change material layer, the second dielectric layer, and the outer phase-change material layer are concentric with the pillar structure.

3. The phase-change memory element as claimed in claim 1, wherein the top surface of the pillar structure and the top surface of the first dielectric layer are coplanar.

4. The phase-change memory element as claimed in claim 1, wherein the top surface of the inner phase-change material layer, the top surface of the outer phase-change material layer, and the top surface of the second dielectric layer are coplanar.

5. The phase-change memory element as claimed in claim 1, wherein the top surface of the inner phase-change material layer and the top surface of the pillar structure are coplanar.

6. The phase-change memory element as claimed in claim 1, wherein the first electrode and the second electrode respectively comprise Al, W, Mo, Ti, TiN, TiAlN, TiW or TaN.

7. The phase-change memory element as claimed in claim 1, wherein the pillar structure consists of a top pillar and a bottom pillar, wherein the top pillar directly contacts the second electrode and the bottom pillar directly contacts the first electrode.

8. The phase-change memory element as claimed in claim 7, wherein the top pillar is made of conductive material comprising Al, W, Mo, Ti, TiN, TiAlN, TiW or TaN.

9. The phase-change memory element as claimed in claim 7, wherein the top pillar is made of dielectric material that is different from that of the bottom pillar.

10. The phase-change memory element as claimed in claim 7, wherein the bottom pillar comprise dielectric material.

11. The phase-change memory element as claimed in claim 1, wherein the inner phase-change material layer, the outer phase-change material layer and the phase-change material collar are formed by the same process and made by the same material.

12. The phase-change memory element as claimed in claim 1, wherein the bottom surface of the inner phase-change material layer, the bottom surface of the outer phase-change material layer, and the bottom surface of the phase-change material collar are coplanar.

13. The phase-change memory element as claimed in claim 1, wherein the second electrode does not directly contact with the outer phase-change material layer.

14. The phase-change memory element as claimed in claim 1, wherein the diameter of the opening is between 15-70 nm.

15. The phase-change memory element as claimed in claim 1, wherein the diameter of the pillar structure is between 5-20 nm.

16. The phase-change memory element as claimed in claim 1, wherein the width of the inner phase-change material layer is between 2-10 nm.

17. The phase-change memory element as claimed in claim 1, wherein the width of the outer phase-change material layer is between 2-10 nm.

18. The phase-change memory element as claimed in claim 1, wherein the width of the second dielectric layer is between 1-28.5 nm.

19. A method for fabricating a phase-change memory element, comprising:
providing a first electrode on the substrate;
forming a first dielectric layer with an opening on the first electrode, wherein the opening exposes a top surface of the first electrode;
conformally forming a second dielectric layer on the first dielectric layer, covering the side walls and the bottom surface of the opening;
forming a non-phase-change material layer on the second dielectric layer as a blanket film;
performing a first planarizing process to remove a portion of the second dielectric layer and the non-phase-change material layer with the first dielectric layer acting as a stop layer, leaving a non-phase-change material pillar and a remaining second dielectric layer;
etching the remaining second dielectric layer with the non-phase-change material pillar as an etching mask, leaving a second dielectric pillar, wherein the non-phase-change material pillar and the second dielectric pillar comprises a pillar structure;
conformally forming a phase-change material layer on the first dielectric layer, the exposed top surface of the first electrode and the pillar structure, defining a collar opening;
forming a third dielectric layer on the phase-change material layer as a blanket film, filling the collar opening;
performing a second planarizing process to remove a portion of the phase-change material layer and the third dielectric layer with the first dielectric layer acting as a stop layer, leaving an inner phase-change material layer surrounding the pillar structure, a remaining third dielectric layer surrounding the inner phase-change material layer, an outer phase-change material layer surrounding the remaining third dielectric layer, and a phase-change material collar formed directly below the remaining third dielectric layer and connecting the inner phase-change material layer and the outer phase-change material layer; and
forming a second electrode formed directly on the pillar structure, directly contacting the top surface of the inner phase-change material layer.

20. The method as claimed in claim 19, wherein the non-phase-change material layer is made of conductive material comprising Al, W, Mo, Ti, TiN, TiAlN, TiW or TaN.

21. The method as claimed in claim 19, wherein the non-phase-change material layer is made of dielectric material that is different from that of the second dielectric layer.

* * * * *